(12) United States Patent
McNeely

(10) Patent No.: US 7,072,418 B2
(45) Date of Patent: Jul. 4, 2006

(54) METHOD AND APPARATUS FOR PERFORMING NYQUIST FOLDING FREQUENCY MODULATION

(75) Inventor: David Lowell McNeely, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 736 days.

(21) Appl. No.: 10/061,102

(22) Filed: Feb. 1, 2002

(65) Prior Publication Data

US 2003/0053551 A1 Mar. 20, 2003

Related U.S. Application Data

(60) Provisional application No. 60/323,174, filed on Sep. 18, 2001.

(51) Int. Cl.
*H04L 27/04* (2006.01)
*H04L 27/12* (2006.01)
*H04L 27/20* (2006.01)

(52) U.S. Cl. ............... 375/295; 375/130; 375/135; 375/146

(58) Field of Classification Search ............. 375/295, 375/316, 307, 260, 222, 355
See application file for complete search history.

(56) References Cited

U.S. PATENT DOCUMENTS

| | | | | |
|---|---|---|---|---|
| 4,682,106 A * | 7/1987 | Vatis et al. | ................. | 324/307 |
| 4,855,894 A | 8/1989 | Asahi et al. | | |
| 5,532,820 A | 7/1996 | Strolle et al. | ............... | 358/310 |
| 5,790,555 A | 8/1998 | Narahashi et al. | .......... | 370/480 |
| 5,796,782 A | 8/1998 | Sagawa | ..................... | 375/296 |
| 5,937,013 A * | 8/1999 | Lam et al. | ................. | 375/340 |
| 6,094,667 A | 7/2000 | Zhou et al. | ................ | 708/321 |
| 6,148,037 A | 11/2000 | Abe | .......................... | 375/321 |
| 6,188,344 B1 | 2/2001 | Eastty et al. | ............... | 341/143 |
| 6,215,430 B1 * | 4/2001 | Smith et al. | ............... | 341/144 |
| 6,253,022 B1 | 6/2001 | Strolle et al. | .............. | 386/109 |

(Continued)

FOREIGN PATENT DOCUMENTS

EP  0 632 577 A1  1/1995

(Continued)

OTHER PUBLICATIONS

EPO Search Report Dated Nov. 17, 2004 Attached.

*Primary Examiner*—Kevin Burd
*Assistant Examiner*—Freshteh N Aghdam
(74) *Attorney, Agent, or Firm*—Joseph J. Laks; Ronald H. Kurdyla; Guy H. Eriksen

(57) ABSTRACT

A method and apparatus for re-modulating an RF carrier modulated signal using a Nyquist folding frequency modulation technique. The method modulates a digitized RF carrier modulated signal with a digital sequence of $\{1,-1, 1,-1, \ldots\}$, where the center frequency of the RF carrier modulated signal is at a first frequency and the sample rate of the modulating signal is at a second frequency. When the second frequency is four times the first frequency, the output of the digital modulation process is a spectrum-inverted copy of the source RF carrier modulated signal. For all other frequencies, the remodulated RF carrier modulated signal has a center frequency equal to the carrier frequency minus one-half the sample rate of the modulating signal. A spectrum inversion is then performed to recreate the spectrum of the source RF carrier modulated signal, which is now located at a different center frequency. The apparatus comprises a modulating signal source and a digital modulator. A resampler and a spectrum inverter may be used as needed.

11 Claims, 2 Drawing Sheets

U.S. PATENT DOCUMENTS

| | | | |
|---|---|---|---|
| 6,366,629 B1 * | 4/2002 | Chen et al. | 375/355 |
| 6,611,565 B1 * | 8/2003 | Bada et al. | 375/295 |
| 2002/0181614 A1 * | 12/2002 | Mostafa et al. | 375/316 |

FOREIGN PATENT DOCUMENTS

| | | |
|---|---|---|
| WO | WO 00/08764 | 2/2000 |

* cited by examiner

METHOD AND APPARATUS FOR PERFORMING NYQUIST FOLDING FREQUENCY MODULATION

CROSS REFERENCES TO RELATED APPLICATIONS

This application claims the benefit of U.S. Provisional Patent Application Ser. No. 60/323,174, filed Sep. 18, 2001, which is incorporated herein by reference in its entirety.

FIELD OF THE INVENTION

The present invention relates to modulating apparatus and method for an radio frequency (RF) carrier signal.

BACKGROUND OF THE INVENTION

Up-converting and down-converting radio frequency (RF) carrier modulated signals is a common practice that is used in RF receivers and transmitters. Such up-converting and down-converting requires the RF carrier modulated signal to be re-modulated to a different RF carrier frequency. This process is performed by one of several techniques:

(1) the RF modulated signal can simply be de-modulated to baseband and re-modulated using a different RF carrier frequency;

(2) a Hilbert Transform process is used to convert a real modulated signal to a complex modulated signal and then modulate the signal with a complex carrier to the desired carrier frequency;

(3) a complex multiplier can be used to perform a first modulation and maintain the signal in complex form, successive modulations will modify the carrier frequency, the real part of the final modulation generates the desired re-modulated signal;

(4) an analog process can be used to re-modulate a real modulated signal carrier at, for example, a carrier $f_o$ with a real carrier at, for example, $f_1 \pm f_o$ and by using a filtering process to remove the undesired images at $f_1 \pm (-f_o)$;

(5) two techniques for re-modulating digital RF carrier modulated signals are disclosed in commonly assigned U.S. patent application Ser. No. 09/382,232, filed Aug. 24, 1999 and U.S. patent application Ser. No. 09/382,234, filed Aug. 24, 1999, both of which are in incorporated by reference.

Each of these techniques for re-modulating an RF carrier modulated signal either operate in the analog domain or require complex circuitry to implement the re-modulation process in the digital domain.

Therefore, there is a need in the art for a simple, digital process for re-modulating an RF carrier modulated signal.

SUMMARY OF THE INVENTION

The present invention is directed to a method and apparatus for re-modulating an RF carrier modulated signal using a Nyquist folding frequency modulation technique. The method modulates a digitized RF carrier modulated signal with a digital sequence of $\{1,-1, 1,-1, \ldots\}$, where the center frequency of the RF carrier modulated signal is at a first frequency and the sample rate of the digital sequence is at a second frequency. When the second frequency is four times the first frequency, the output of the digital modulation process is a spectrum-inverted copy of the source RF carrier modulated signal (the carrier frequency is not changed). For other choices of the second frequency (i.e., the sample rate), the carrier frequency shifts from the first frequency to a third frequency equal to the difference between the first frequency (original carrier) and one-half the second frequency (sample rate). If the spectral inversion is not desired, a second spectral inversion is performed, either before or after the modulation process. A Nyquist folding frequency modulator that alters the center frequency of an RF carrier modulated signal is formed using a resampler, a digital modulator, and a spectrum inverter.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
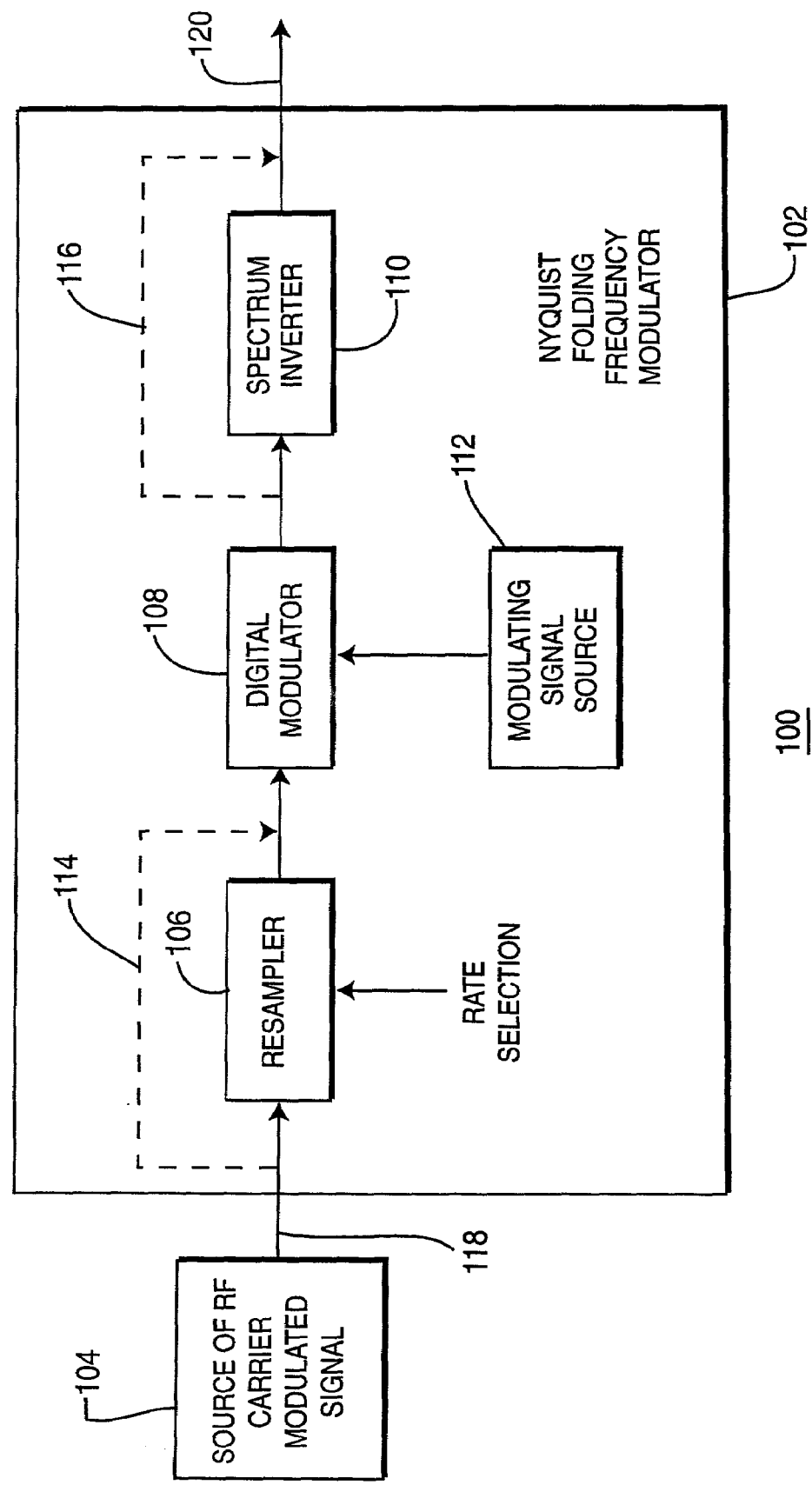
FIG. 1 is a functional block diagram of a digitized RF signal source coupled to a Nyquist folding frequency modulator, in accordance with the principles of the present invention.

FIG. 1 depicts a functional block diagram of a Nyquist folding frequency modulator 102 coupled to an RF carrier modulated signal source 104. The source 104 provides a digitized RF carrier modulated signal having a defined bandwidth and a center frequency at carrier frequency $f_o$. The RF carrier modulated signal is coupled to port 118 of the Nyquist folding frequency modulator 102. The Nyquist folding frequency modulator 102 comprises a resampler 106, a digital modulator 108, a spectrum inverter 110, and a modulating signal source 112. The resampler 106 changes the sampling rate of the RF carrier modulated signal. The sample rate at the output of resampler 106 is equal to twice the sum of the desired RF center frequency (frequency 3) and the present RF center frequency (frequency 1). The resampling process does not alter the carrier frequency of the RF carrier modulated signal but rather the density of samples representing the RF Signal. If the sampling rate at the input to resampler 106 equals the sample rate required at the output of the resampler 106, the resampler is not needed and would be bypassed as represented by path 114. Additionally, if the RF carrier modulated signal is an analog signal, then the resampler can be an analog-to-digital converter that samples the RF carrier modulated signal at the required sampling rate.

The sampled RF carrier modulated signal (whether resampled or not) is coupled to a digital modulator 108. The modulating signal source 112 provides a repeating digital sequence of $\{1,-1, 1,-1, \ldots\}$ that is provided at a sample rate ($f_s$) equal to the resampler output sample rate. The center frequency of the output signal from the digital modulator 108 depends upon the relationship of the sample rate ($f_s$) and the carrier frequency ($f_0$) of the RF carrier modulated signal. If the sample rate ($f_s$) is exactly four times the carrier frequency ($f_0$), then the center frequency of the output signal is the same as the carrier frequency ($f_0$). The output of the digital modulator 108 is then the spectrum of the RF carrier modulated signal at a carrier frequency of $f_0$. However, the digital modulator 108 using this particular modulating signal causes the spectrum of the RF carrier modulated signal to be inverted.

If the sample rate ($f_s$) is not four times the carrier frequency ($f_0$), then the center frequency of the output signal is shifted to a carrier frequency ($f_1$) equal to one-half the sample rate minus the original RF carrier frequency i.e., ($f_s/2-f_0$). The output of the digital modulator 108 is then the spectrum of the RF carrier modulated signal at a carrier frequency of $f_1$ with an inverted spectrum for the RF carrier modulated signal.

A spectrum inverter 110 is applied to invert the RF signal spectrum and leave the carrier at $f_0$ or $f_1$. The output at port 120 is the source RF carrier modulated signal at a carrier of frequency $f_0$ or $f_1$.

The spectrum inversion may be accomplished by performing an even number of Nyquist folding frequency modulations in the up-modulation chain. As such, the resampling and digital modulation would be repeated within the spectrum inverter 110 to achieve a non-inverted RF carrier modulated signal output. Another technique for performing spectrum inversion could be applied prior to remodulation (i.e., when the baseband signal was first modulated onto a carrier). Such techniques include inverting the sign of the "imaginary" component of the complex baseband signal or changing the sign of the frequency of the first modulation complex carrier (invert the sine component). An additional spectral inversion can also be applied in the analog RF processing which often resides prior to or after the Nyquist folding frequency modulator 102.

For some types of RF carrier modulated signals, the spectrum inversion may just be ignored as irrelevant. For example, for amplitude modulation (AM), the spectrum inversion has no effect.

In alternative embodiments of the invention, where a signal inversion is desired, the spectrum inverter 110 may be excluded from the Nyquist folding frequency modulator 102 as represented by dashed line 116.

Figure 2:
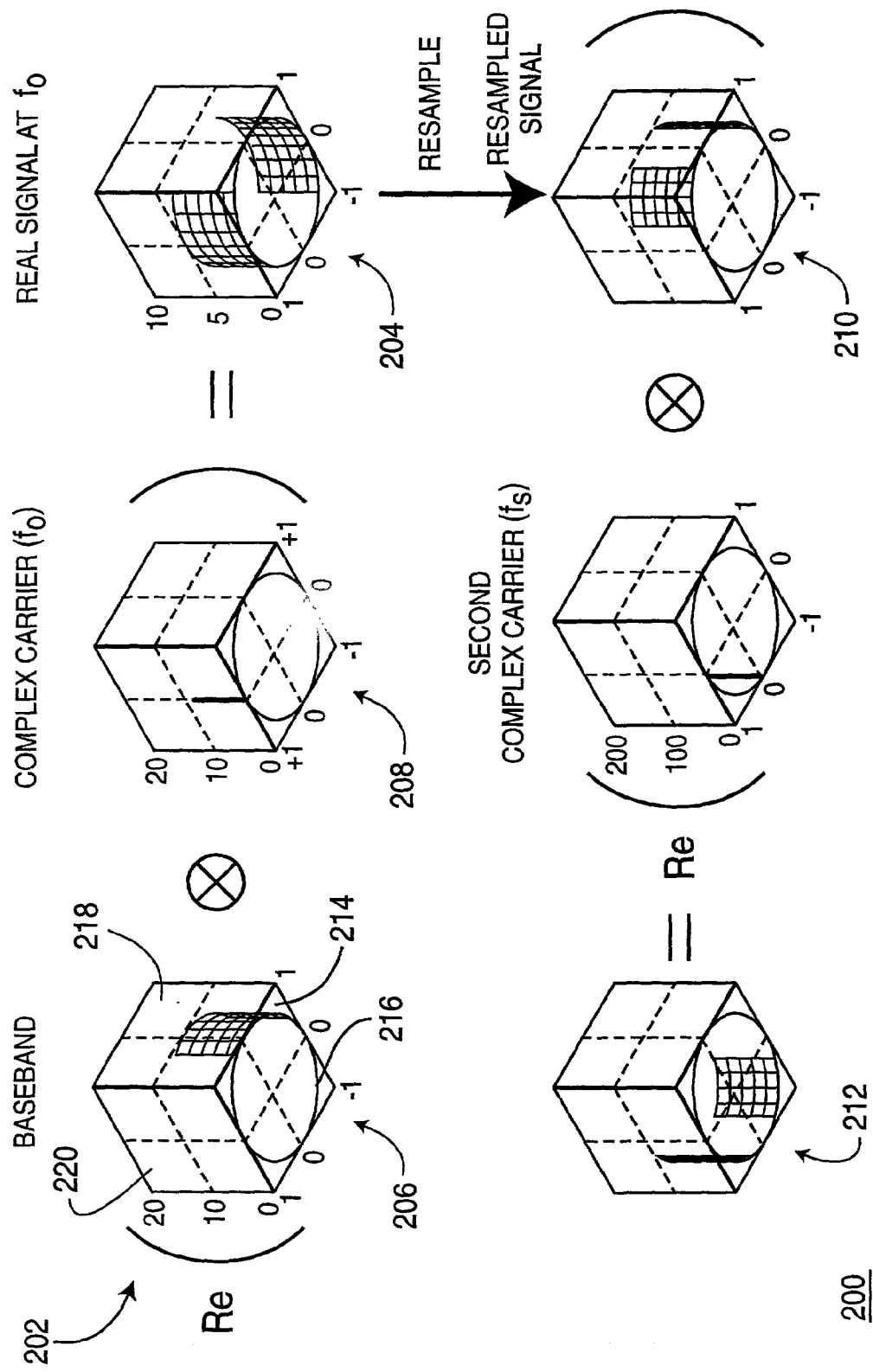
FIG. 2 depicts a z-Plane representation of the method for performing Nyquist folding frequency modulation in accordance with the principles of the present invention.

FIG. 2 depicts a z-Plane representation 200 of the method of performing Nyquist folding frequency modulation of the present invention. The RF carrier modulated signal is represented by the real part of the baseband signal 206 convolved with the complex carrier 208. This process is represented at reference number 202. The folding frequency modulation technique takes advantage of the fact that sampled data in the frequency domain is linearly cyclic. The highest frequency of the cyclic frequencies is termed the Nyquist Folding Frequency (half of the sampling rate ($f_s$). In a z-Plane representation, each point along the circumference of a unit circle corresponds to a different complex carrier, $e^{(j\omega_o n)}$, $\omega \in [-\pi,\pi]$, where $\pi$ is a normalized radian frequency corresponding to the Nyquist Folding Frequency.

One of these carriers is unique in that it is real, $e^{j\pi \cdot n}$=Cos ($\pi \cdot n$). There is no corresponding complex carrier in the continuous time unbounded frequency domain. When this special carrier is combined with sample rate conversion (time scale change), re-modulation can be performed without the attendant extra processing of the various methods of the prior art. Each 3D graph diagrams the z-Plane frequency domain of a signal. Note that while multiple iterations could be used to advantage in some applications, only one stage of re-modulation is diagrammed in FIG. 2. The three planes 214, 218 and 220 identifiable in FIG. 2 (for clarity the planes are only labeled with respect to the representation of the baseband signal 206) are:

1) The bottom plane 214 shows the unit circle 216 where each point on its circumference represents a different complex frequency.

2) The right plane 218 intersects with the bottom plane 214 and is tangent to the point on the unit circle 216 corresponding to frequency=0 as well as perpendicular to the bottom plane 214.

3) The left plane 220 intersects with the bottom plane 214 and is tangent to a point on the unit circle 220, $$\frac{\pi}{2},$$

corresponding to the frequency, $$\frac{f_s}{4},$$

where $f_s$=the sampling rate of the modulating signal. The magnitude of the frequency response at a given frequency is given by the height above the unit circle in each three-dimensional graph. Convolution in the cyclic frequency domain corresponds to multiplication in the linear unbounded sampled time domain, as such, the method of FIG. 2 proceeds as follows.

The modulated signal is generally created as the real part of a time domain product of a complex base band signal 206 having a zero frequency carrier 208 having a complex carrier frequency of $f_0$. The real portion of this signal is represented by graph 204. At step 210, the signal 204 is resampled to a predefined sample rate and modulated by the repeating sequence $\{1,-1, 1,-1, \ldots \}$ at a sample rate ($f_s$) that yields an RF carrier modulated signal with a carrier at frequency $f_1$. A side effect of the second modulation is that the sine component is inverted by this operation. This inversion can be reversed as described above. The output frequency of the digital RF is at the difference frequency ($f_1$) of the carrier ($f_0$) and one-half the sampling rate ($f_s$) as depicted in the graph 212.

While foregoing is directed to the preferred embodiment of the present invention, other and further embodiments of the invention may be devised without departing from the basic scope thereof, and the scope thereof is determined by the claims that follow.

The invention claimed is:

1. A method for re-modulating a signal comprising:
   modulating a radio frequency carrier modulated signal having a center frequency of a first frequency and time sampled at a second frequency with a repeating sample sequence of $\{1,-1,1,-1, \ldots \}$ at the sample rate of the second frequency to produce a remodulated radio frequency carrier modulated signal whose center frequency is a third frequency, wherein said second frequency is equal to four times the first frequency resulting in the third frequency being equal to the first frequency.

2. The method of claim 1 further comprising:
   resampling the digitized radio frequency carrier modulated signal prior to said modulating step.

3. The method of claim 1 further comprising:
   inverting a spectrum of the remodulated radio frequency carrier modulated signal.

4. A method for re-modulating a radio frequency carrier modulated signal comprising:
- sampling an analog radio frequency carder modulated signal to form a digitized radio frequency carrier modulated signal having a carrier frequency of a first frequency;
- modulating the digitized radio frequency carrier modulated signal with a repeating sequence of $\{1,-1, 1,-1, \ldots\}$ having a sample rate of a second frequency to produce a remodulated radio frequency carrier modulated signal whose center frequency is a third frequency, said second frequency being equal to four times the first frequency resulting in the third frequency being equal to the first frequency and a spectrum of the remodulated radio frequency carrier modulated signal being inverted; and
- re-inverting the spectrum of the remodulated radio frequency carrier modulated signal.

5. The method of claim 4 wherein said remodulated radio frequency carrier modulated signal has a carrier frequency equal to the first frequency minus one-half of the second frequency.

6. The method of claim 4 wherein said sampling is performed by an analog-to-digital converter.

7. A method for re-modulating a radio frequency carrier modulated signal comprising:
- resampling a digital radio frequency carrier modulated signal to form a digitized radio frequency carrier modulated signal having a carrier frequency of a first frequency;
- modulating the digitized radio frequency carrier modulated signal with a repeating sequence of $\{1,-1, 1,-1, \ldots\}$ having a sample rate of a second frequency to produce a remodulated radio frequency carrier modulated signal whose center frequency is a third frequency, said second frequency being equal to four times the first frequency resulting in the third frequency being equal to the first frequency and a spectrum of the remodulated radio frequency carrier modulated signal being inverted; and
- re-inverting the spectrum of the remodulated radio frequency carrier modulated signal.

8. The method of claim 7 wherein said remodulated radio frequency carrier modulated signal has a carrier frequency equal to the first frequency minus one-half of the second frequency.

9. Apparatus for re-modulating a signal comprising:
- a modulating signal source providing a repeating digital sequence of $\{1,-1,1,-1, \ldots\}$ having a sample rate of a second frequency;
- a digital modulator for sampling a digitized radio frequency carrier modulated signal having a center frequency of a first frequency using the digital sequence to produce a remodulated radio frequency carrier modulated signal whose carrier is a third frequency, wherein said second frequency is equal to four times the first frequency resulting in the third frequency being equal to the first frequency and a spectrum of the remodulated radio frequency carrier modulated signal being inverted.

10. The apparatus of claim 9 further comprising:
- a resampler for resampling the digitized radio frequency carrier modulated signal prior to said digital modulator.

11. The apparatus of claim 9 further comprising:
- a spectrum inverter for re-inverting the spectrum of the remodulated radio frequency carrier modulated signal.

* * * * *